(12) United States Patent
Kihara et al.

(10) Patent No.: US 11,566,953 B2
(45) Date of Patent: Jan. 31, 2023

(54) DEFORMATION DETECTION SENSOR, ELECTRONIC DEVICE, AND METHOD FOR MANUFACTURING DETECTING DEFORMATION DETECTION SENSOR

(71) Applicant: Murata Manufacturing Co., Ltd., Nagaokakyo (JP)

(72) Inventors: Takashi Kihara, Nagaokakyo (JP); Jun Endo, Nagaokakyo (JP); Masamichi Ando, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1057 days.

(21) Appl. No.: 16/245,715

(22) Filed: Jan. 11, 2019

(65) Prior Publication Data

US 2019/0145838 A1 May 16, 2019

Related U.S. Application Data

(63) Continuation of application No. PCT/JP2017/025706, filed on Jul. 14, 2017.

(30) Foreign Application Priority Data

Aug. 3, 2016 (JP) .............................. JP2016-152500

(51) Int. Cl.
*G01L 1/16* (2006.01)
*G01L 5/22* (2006.01)
(Continued)

(52) U.S. Cl.
CPC ................ *G01L 1/162* (2013.01); *G01L 1/16* (2013.01); *G01L 5/22* (2013.01); *G01L 9/08* (2013.01); *H01L 41/1132* (2013.01)

(58) Field of Classification Search
CPC ... G01L 1/162; G01L 1/16; G01L 5/22; G01L 9/08; H01L 41/1132
See application file for complete search history.

(56) References Cited

U.S. PATENT DOCUMENTS

| 4,584,625 A | 4/1986 | Kellogg |
| 5,515,738 A * | 5/1996 | Tamori ...................... G01L 1/16 |
| | | 73/862.626 |

(Continued)

FOREIGN PATENT DOCUMENTS

| JP | 2006048302 A | 2/2006 |
| JP | 2009080090 A | 4/2009 |

(Continued)

OTHER PUBLICATIONS

International Search Report issued in PCT/JP2017/025706, dated Aug. 15, 2017.

(Continued)

*Primary Examiner* — Octavia Davis Hollington
(74) *Attorney, Agent, or Firm* — ArentFox Schiff LLP

(57) ABSTRACT

A deformation detection sensor that includes a conductive member, a plurality of thermoplastic resin layers, and a piezoelectric film. At least one of the thermoplastic resin layers has a main surface, and the conductive member is formed on the main surface thereof. The plurality of thermoplastic resin layers are laminated and integrally formed by hot pressing into a laminated body. A transmission line is formed form a first portion of the conductive member and the thermoplastic resin in the laminated body. The piezoelectric film is attached to the laminated body to form a piezoelectric element made of a second portion of the conductive member, the thermoplastic resin in the laminated body, and the piezoelectric film.

10 Claims, 9 Drawing Sheets

(51) Int. Cl.
  *G01L 9/08* (2006.01)
  *H01L 41/113* (2006.01)

(56) References Cited

U.S. PATENT DOCUMENTS

| | | | |
|---|---|---|---|
| 7,446,456 B2 | 11/2008 | Maruyama et al. | |
| 7,554,246 B2 | 6/2009 | Maruyama et al. | |
| 8,299,686 B2 * | 10/2012 | Yamamoto | F03G 7/005 |
| | | | 310/338 |
| 8,692,125 B2 | 4/2014 | Kato et al. | |
| 8,993,893 B2 | 3/2015 | Kato et al. | |
| 9,173,289 B2 | 10/2015 | Kato et al. | |
| 9,178,491 B2 * | 11/2015 | Takemura | H03H 9/706 |
| 11,043,626 B2 * | 6/2021 | Yosui | H05K 1/181 |
| 2006/0028095 A1 | 2/2006 | Maruyama et al. | |
| 2006/0238069 A1 | 10/2006 | Maruyama et al. | |
| 2007/0080608 A1 | 4/2007 | Maruyama et al. | |
| 2007/0096594 A1 | 5/2007 | Maruyama et al. | |
| 2012/0138340 A1 | 6/2012 | Kato et al. | |
| 2014/0118084 A1 * | 5/2014 | Takemura | H03H 9/0576 |
| | | | 333/133 |
| 2014/0166344 A1 | 6/2014 | Kato et al. | |
| 2015/0155470 A1 * | 6/2015 | Mori | H01L 41/0973 |
| | | | 310/326 |
| 2015/0173184 A1 | 6/2015 | Kato et al. | |

FOREIGN PATENT DOCUMENTS

| | | | | |
|---|---|---|---|---|
| JP | 2014007197 A | | 1/2014 | |
| JP | 2015069264 | * | 4/2015 | G01L 1/16 |
| JP | 2015227839 A | | 12/2015 | |
| WO | 2011018979 A1 | | 2/2011 | |

OTHER PUBLICATIONS

Written Opinion of the International Searching Authority issued in PCT/JP2017/025706, dated Aug. 15, 2017.

\* cited by examiner

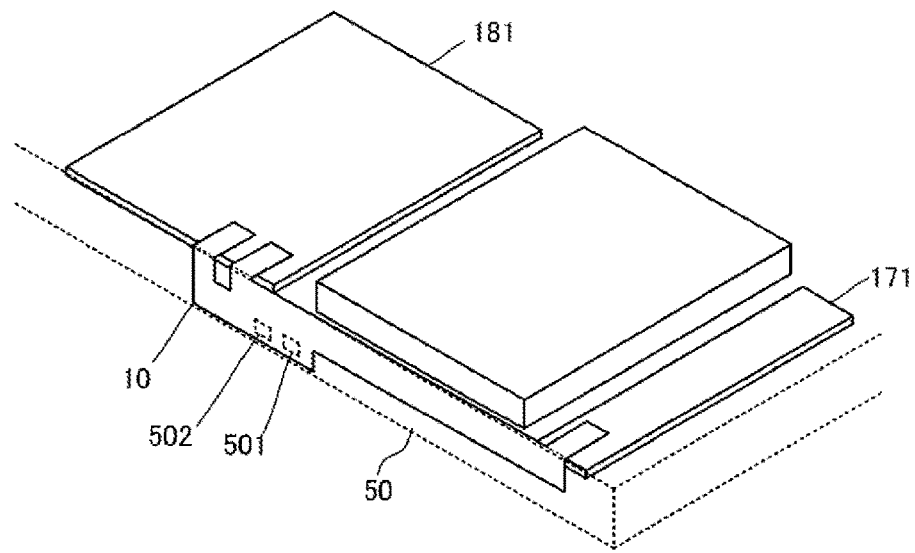
FIG. 7(A)
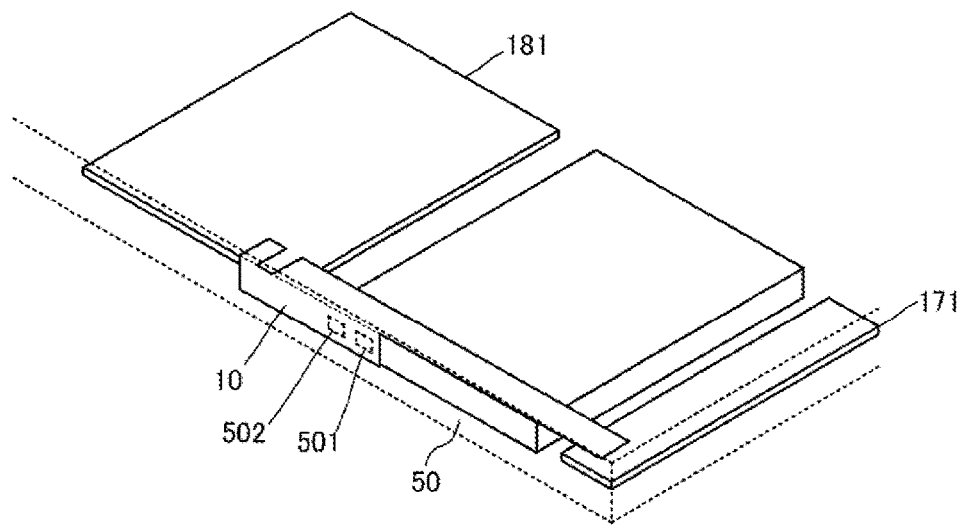
FIG. 7(B)
FIG. 8
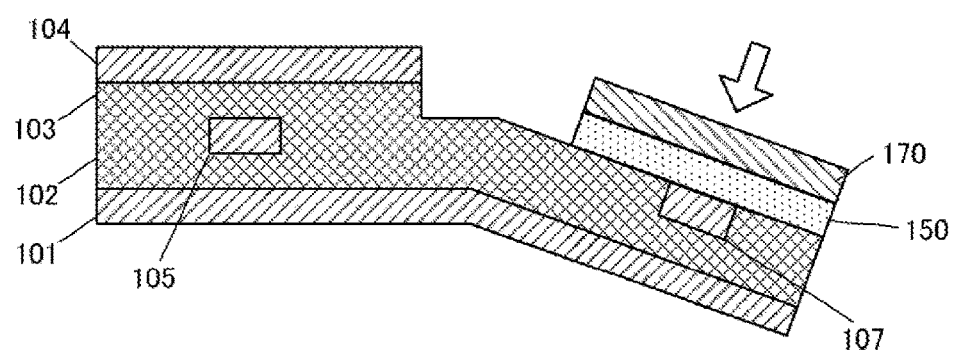

DEFORMATION DETECTION SENSOR, ELECTRONIC DEVICE, AND METHOD FOR MANUFACTURING DETECTING DEFORMATION DETECTION SENSOR

CROSS REFERENCE TO RELATED APPLICATIONS

The present application is a continuation of International application No. PCT/JP2017/025706, filed Jul. 14, 2017, which claims priority to Japanese Patent Application No. 2016-152500, filed Aug. 3, 2016, the entire contents of each of which are incorporated herein by reference.

FIELD OF THE INVENTION

The present invention relates to a deformation detection sensor that detects a deformation operation on an operation object, an electronic device that includes the deformation detection sensor, and a method for manufacturing the deformation detection sensor.

BACKGROUND OF THE INVENTION

In recent years, a large number of electronic components have been mounted in portable electronic devices such as smartphones.
Patent Document 1 discloses a transmission line formed of a thermoplastic resin having flexibility, as an example of an electronic component.
Patent Document 1: PCT International Publication No. WO2011/018979

SUMMARY OF THE INVENTION

In recent years, downsizing of electronic components has been demanded. On the other hand, the number of electronic components to be mounted is increasing.

Accordingly, an object of the present invention is to provide a deformation detection sensor that not only functions as a transmission line, but also is capable of performing an additional plurality of functions, an electronic device including the deformation detection sensor, and a method for manufacturing the deformation detection sensor.

The deformation detection sensor in accordance with an aspect of the present invention includes a conductive member, a plurality of thermoplastic resin layers, and a piezoelectric film. At least one of the thermoplastic resin layers has a main surface, and the conductive member is formed on the main surface thereof. The plurality of thermoplastic resin layers are laminated and integrally formed by hot pressing into a laminated body. a transmission line is formed from a first portion of the conductive member and the thermoplastic resin in the laminated body. The piezoelectric film is attached to the laminated body to form a piezoelectric element made of a second portion of the conductive member, the thermoplastic resin in the laminated body, and the piezoelectric film.

The transmission line and the deformation detection sensor are thus simply integrated to one thermoplastic resin (an insulating base material having flexibility, such as polyimide, PET or liquid crystal polymer), whereby high heat is not applied to the piezoelectric film constituting the deformation detection sensor during manufacture. This is because the piezoelectric film is attached to the laminated body after the laminated body is formed by hot pressing, so that high heat is not applied to the piezoelectric film.

According to the present invention, it is possible to realize the deformation detection sensor that not only functions as a transmission line, but also is capable of performing an additional plurality of functions.

BRIEF EXPLANATION OF THE DRAWINGS

FIGS. 7(A) and 7(B) are views illustrating an example of an arrangement aspect of the deformation detection sensor in the casing.
FIG. 8 is a cross-sectional view when a bent portion is provided in the deformation detection sensor.

DETAILED DESCRIPTION OF THE INVENTION

Figure 1:
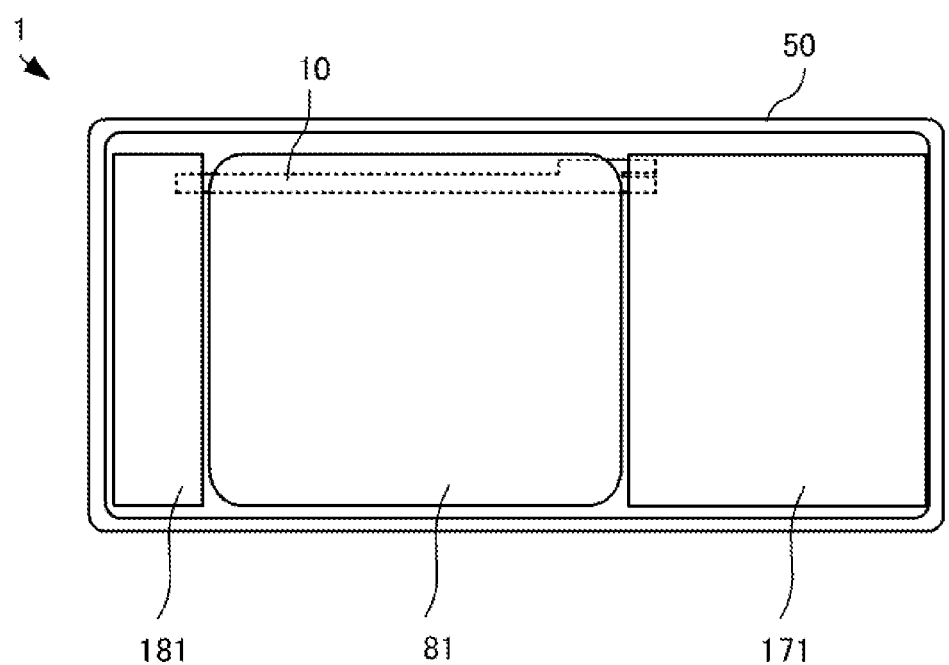
FIG. 1 is a plan view of an electronic device including a deformation detection sensor.

FIG. 1 is a plan view of an electronic device 1 including a deformation detection sensor 10. In FIG. 1, only major components are illustrated, and other components are omitted.

The electronic device 1 is an information processing device such as a smartphone. As illustrated in FIG. 1, the electronic device 1 includes a casing 50. The casing 50 houses the deformation detection sensor 10, a printed circuit board 171, a printed circuit board 181, and a battery module 81.

For example, various components such as a controller, a memory, and a camera module of the electronic device 1 are mounted on the printed circuit board 171. For example, a component such as an antenna is mounted on the printed circuit board 181. The printed circuit board 171 and the printed circuit board 181 are connected via the deformation detection sensor 10.

Figure 2A:
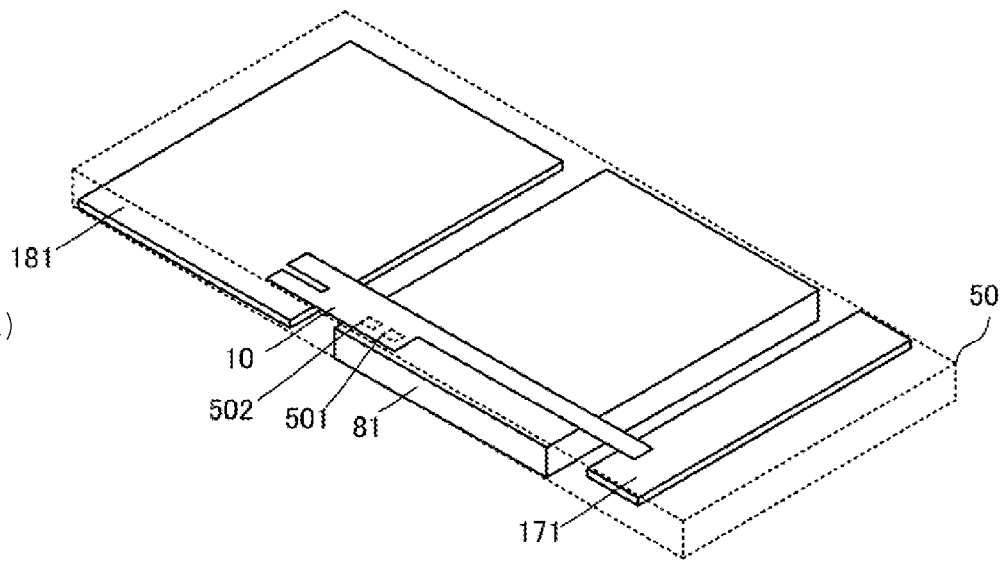
FIG. 2(A) is a transparent perspective view from a rear surface side of a casing.
Figure 2B:
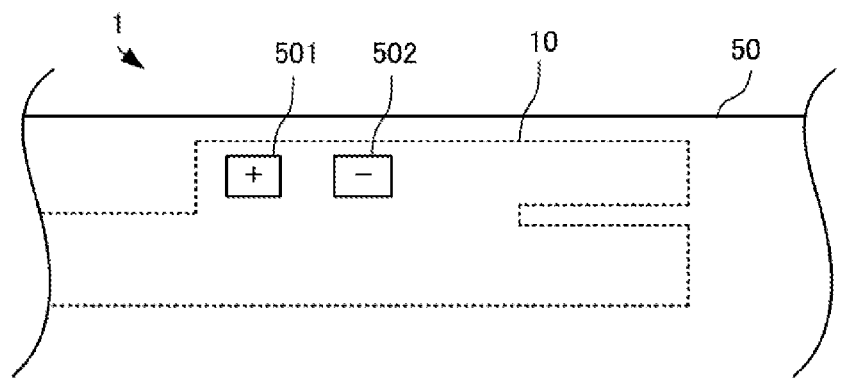
FIG. 2(B) is a partially enlarged view of the rear surface of the casing.

The deformation detection sensor 10 is in contact with the inner surface of the casing 50 and detects a deformation operation on the casing 50. FIG. 2(A) is a transparent perspective view from a rear surface side of the casing, and FIG. 2(B) is a partially enlarged view of the rear surface of the casing. As illustrated in FIGS. 2(A) and 2(B), a volume operation unit 501 displayed as "+" and a volume operation unit 502 displayed as "−" are arranged on the rear surface of the casing 50. The volume operation unit 501 and the volume operation unit 502 are formed on the surface of the casing 50 by printing or the like, but are not physical operators. A user presses the position of the volume operation unit 501 or the volume operation unit 502 in the casing 50 to perform a volume change operation.

When the user presses the position of the volume operation unit 501 or the volume operation unit 502 in the casing 50 in order to perform the volume change operation, the bottom surface of the casing 50 is distorted at the center of the pressing position toward the inner surface side. The deformation detection sensor 10 is in contact with the casing 50, and thus the sensor is distorted along with the distortion of the casing 50. The deformation detection sensor 10 has a detection electrode at a position corresponding to the position of the volume operation unit 501 or the volume operation unit 502, detects distortion at the position corresponding to the position of the volume operation unit 501 or the volume operation unit 502, and receives the volume change operation corresponding to the detected distortion.

FIGS. 3(A), 3(B), 3(C) and 3(D) are exploded perspective views illustrating the structure of the deformation detection sensor 10. FIG. 4 is a cross-sectional view of line A-A in FIG. 3(C).

In FIGS. 3(A), 3(B), 3(C) and 3(D), the deformation detection sensor 10 includes a first ground conductor 101, a resin base material 102, a resin base material 103, a second ground conductor 104, a signal line conductor 105, a first detection electrode 107, a second detection electrode 109, a piezoelectric film 150, and a conductive thin film member 170. As illustrated in FIGS. 11(A), 11(B), 11(C) and 11(D), a slit 1021 may be provided between the first detection electrode 107 and the second detection electrode 109 of the resin base material 102. The slit 1021 extends from the outer side of the resin base material 102 toward the center thereof. Further, a through hole or a groove may be provided in place of the slit 1021. That is, the resin base material 102 may have a portion thereof removed between the first detection electrode 107 and the second detection electrode 109 (a first conductive member and a second conductive member). A length of the slit 1021 is not limited as long as the slit 1021 is at least slightly located between the first detection electrode 107 and the second detection electrode 109. The slit 1021 assists in preventing deformation of the resin base material 102 from being transmitted to the second detection electrode 109 when the first detection electrode 107 is pressed. Similarly, the slit 1021 assists in preventing deformation of the resin base material 102 from being transmitted to the first detection electrode 107 when the second detection electrode 109 is pressed. This prevents unintentional reaction of the adjacent operation units.

In FIGS. 3(A), 3(B), 3(C) and 3(D), the resin base material 102 and the resin base material 103 are described as separate configurations. However, as illustrated in FIG. 4, the resin base material 102 and the resin base material 103 are preferably made of the same kind of thermoplastic resin, and are integrated by hot pressing.

The thermoplastic resin is a resin base material having flexibility, and is made of, for example, a liquid crystal polymer resin. It is to be noted that examples of thermoplastic resins other than the liquid crystal polymer resin include polyetheretherketone (PEEK), polyetherimide (PEI), polyphenylene sulfide (PPS), polyimide (PI), and these resins may be used in place of the liquid crystal polymer resin. It is to be noted that, since the liquid crystal polymer is excellent in water resistance, it is possible to realize a stable pressure sensitivity even under a humid environment by laminating the liquid crystal polymer on both sides of the piezoelectric film which is susceptible to humidity like PLLA.

FIGS. 5(A), 5(B), 5(C) and 5(D) are views illustrating the method for manufacturing the deformation detection sensor.

Figure 5A:
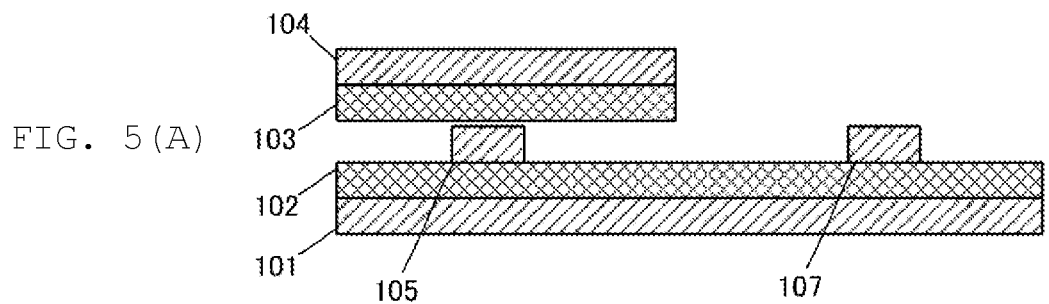
FIGS. 5(A), 5(B), 5(C) and 5(D) are views illustrating a step of manufacturing the deformation detection sensor.
Figure 5B:
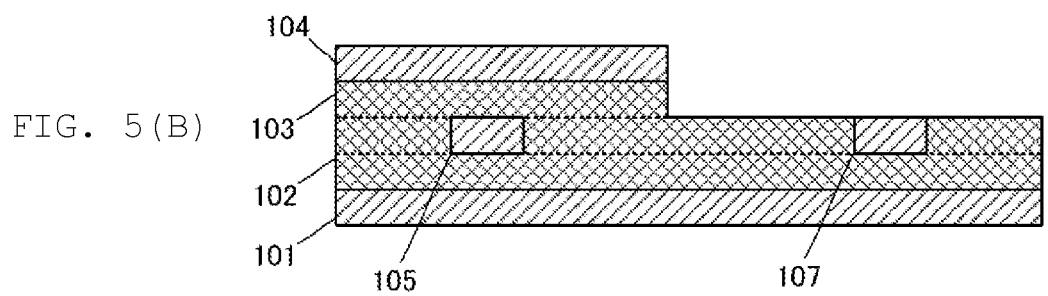

As illustrated in FIG. 5(A), a thermoplastic resin having a main surface on which a conductive member is formed is first prepared in order to manufacture the deformation detection sensor 10. At this time, in the conductive member formed on the upper surface of the resin base material 102, the signal line conductor 105, the first detection electrode 107, the second detection electrode 109, and other wiring lines are patterned. The signal line conductor 105, the first detection electrode 107, and the second detection electrode 109 are integrally formed by etching or the like, so that an interval between the electrodes can be made constant. The conductive member formed on the lower surface of the resin base material 102 becomes the first ground conductor 101. Then, as illustrated in FIG. 5(B), a plurality of thermoplastic resins (in this example, the resin base material 102 and the resin base material 103) are laminated and hot-pressed to obtain an integrally formed laminated body.

In this manner, a triplate-type transmission line is made of the first ground conductor 101 formed on the lower surface of the resin base material 102, the signal line conductor 105 formed on the upper surface of the resin base material 102, and the second ground conductor 104 formed on the upper surface of the resin base material 103. As illustrated in FIG. 1, the transmission line is connected to the printed circuit board 171 and the printed circuit board 181 to transmit a high frequency signal.

Figure 5C:
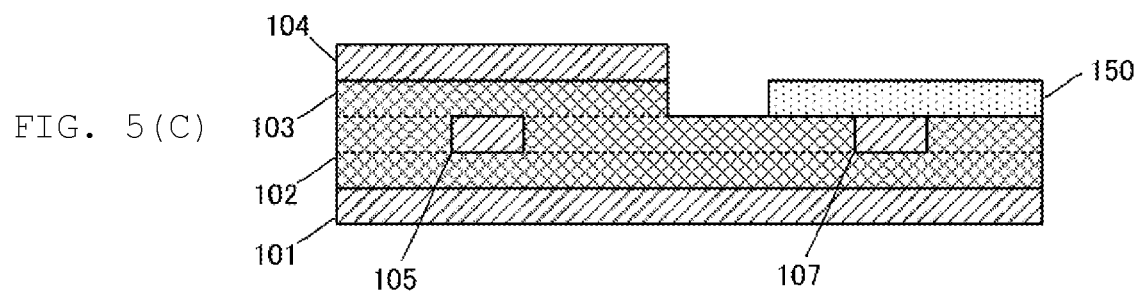

Thereafter, as illustrated in FIG. 5(C), in the laminated body, the piezoelectric film 150 is attached to the upper surface of the resin base material 102 using an adhesive or the like so as to cover the first detection electrode 107 and the second detection electrode 109.

For example, PVDF or a chiral polymer is used for the piezoelectric film 150. In the case of using the chiral polymer, more preferably, uniaxially stretched polylactic acid (PLA) is used, and more specifically, L-type polylactic acid (PLLA) is used. The uniaxial stretching direction of the polylactic acid is a direction forming approximately 45° with respect to the longitudinal direction of the piezoelectric film 150. Approximately 45° means 45°±10°. When the uniaxial stretching direction is 45±10°, the piezoelectric film 150 can exhibit good pressure sensitivity. Further, the uniaxial stretching direction may be in a range greater than ±10° depending on the intended use.

The chiral polymer has a main chain in a helical structure, and has piezoelectricity by uniaxial stretching to obtain molecule orientation. The chiral polymer produces the piezoelectricity in a molecule orientation processing by stretching or the like, and does not need to be subjected to poling processing unlike other polymers such as PVDF and piezoelectric ceramics. Particularly, since polylactic acid has no pyroelectricity, even when the user presses the casing 50 and the heat of the user's finger or the like is transmitted, the amount of the detected electric charge remains unchanged. Further, a piezoelectric constant of uniaxially stretched PLLA belongs to a group of very high piezoelectric constants among polymers. For example, PLLA can achieve a high piezoelectric strain constant $d14$ of 10 to 20 pC/N if the conditions such as a stretching condition, a heat treatment condition, and formulation of additives, are right. Furthermore, the piezoelectric constant of PLLA does not fluctuate over time and is extremely stable.

It is to be noted that a stretch ratio of the piezoelectric film is preferably about three to eight times. Performing heat treatment after stretching encourages crystallization of extended chain crystal of polylactic acid to improve the piezoelectric constant. It is to be noted in the case of biaxial stretching, it is possible to obtain a similar effect to that of uniaxial stretching by making stretch ratios of the respective axes different. For example, when a film is stretched eight times in a direction as an X axis direction and is stretched two times in a Y axis direction orthogonal to the X axis, it is possible to obtain almost the same effect of the piezoelectric constant as the case where a film is uniaxially stretched about four times in the X axis direction. Since a simply uniaxially stretched piezoelectric film is likely to split along a stretching axis direction, it is possible to increase the strength to some extent by biaxially stretching as described above.

Figure 5D:
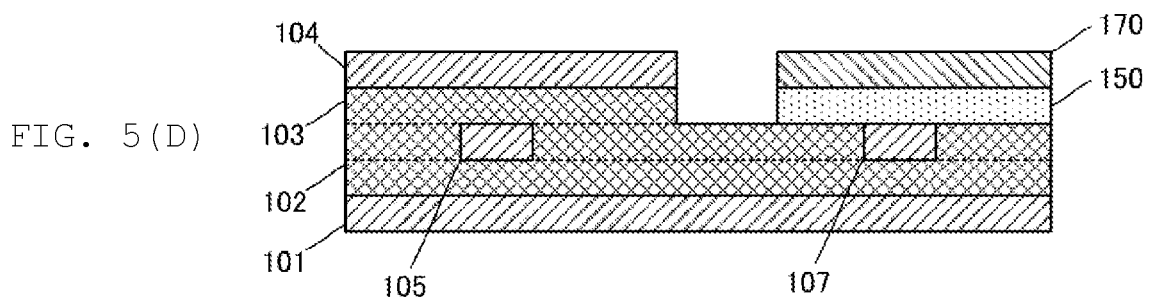
Figure 10:
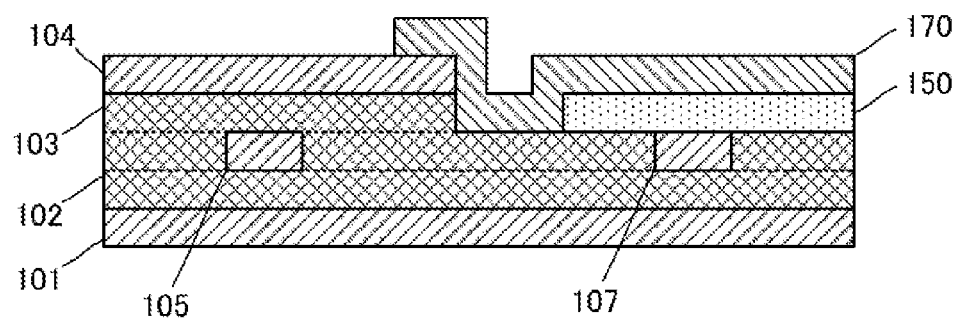
FIG. 10 is a cross-sectional view illustrating an example in which a conductive thin film member is connected to a second ground conductor.
Figure 11A:
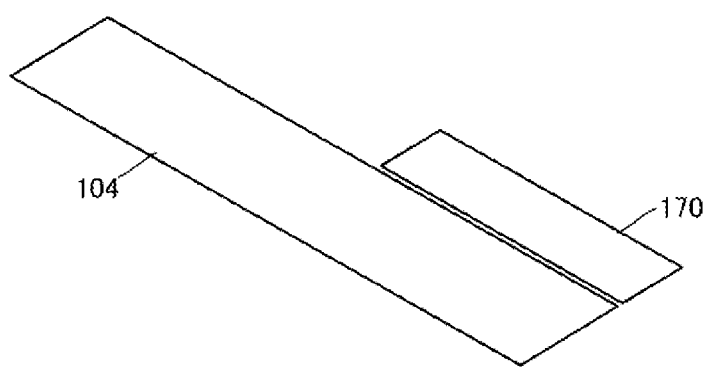
FIGS. 11(A), 11(B), 11(C) and 11(D) are exploded perspective views of the deformation detection sensor.
Figure 11B:
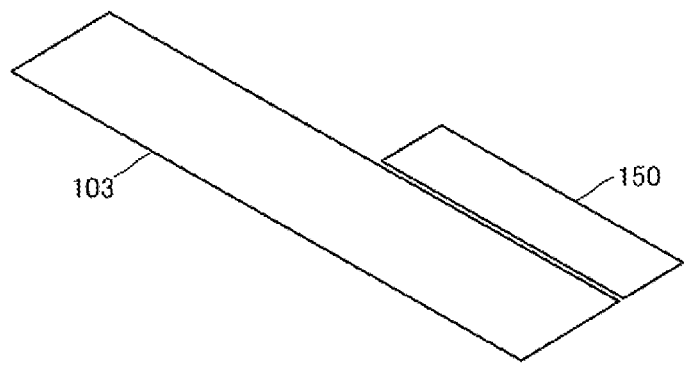
Figure 11C:
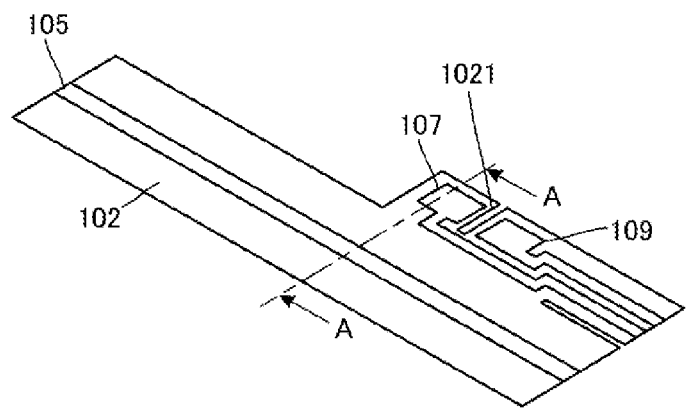
Figure 11D:
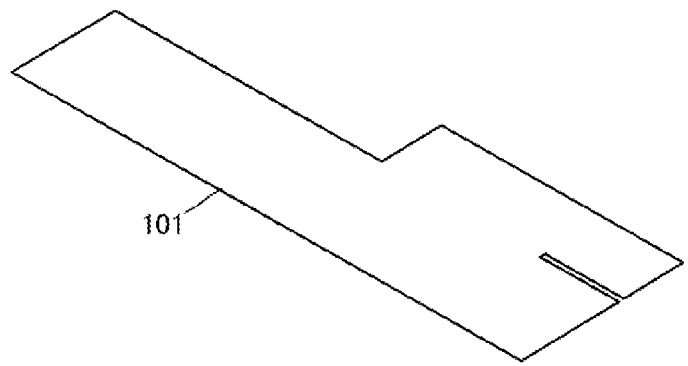

Next, as illustrated in FIG. 5(D), the conductive thin film member 170 is attached to the upper surface of the piezoelectric film 150. The conductive thin film member 170 functions as a ground conductor (a shield conductor). For example, a conductive nonwoven fabric with an adhesive formed thereon or a resin-impregnated copper foil with an adhesive formed thereon is used for the conductive thin film member 170. The conductive thin film member 170 has lower rigidity than that of the first ground conductor 101 and the second ground conductor 104 so as not to hinder the deformation of the piezoelectric film 150. As illustrated in FIG. 10, the conductive thin film member 170 may be connected to the second ground conductor 104. However, the conductive thin film member 170 is not an essential component.

The piezoelectric film 150 is attached to the laminated body in the above-described manner so that a piezoelectric element is made of the first detection electrode 107 and the second detection electrode 109 formed on the upper surface of the resin base material 102 and the piezoelectric film 150. The piezoelectric element is connected to a not-illustrated controller of the deformation detection sensor 10 (or the controller of the electronic device 1) via wiring lines. The controller detects electric charges generated in the first detection electrode 107 and the second detection electrode 109 to detect distortion of the position of the volume operation unit 501 or the volume operation unit 502 in the casing 50, and receives the volume change operation from the user.

The deformation detection sensor 10 has a structure in which the piezoelectric film 150 is attached to the laminated body integrally formed by hot pressing after the hot pressing. Therefore, high heat is not applied to the piezoelectric film 150 at the time of manufacturing the deformation detection sensor 10.

Figure 3A:
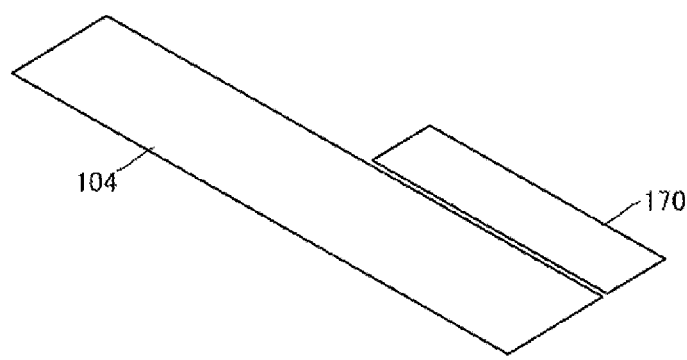
FIGS. 3(A), 3(B), 3(C) and 3(D) are exploded perspective views of the deformation detection sensor.
Figure 3B:
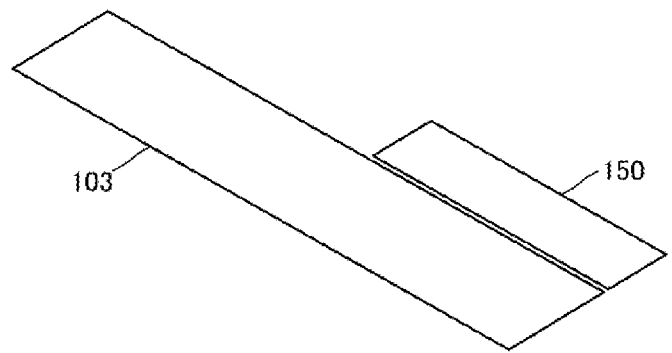
Figure 3C:
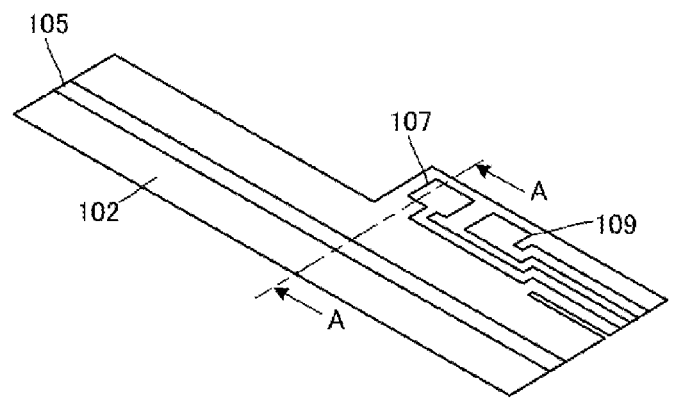
Figure 3D:
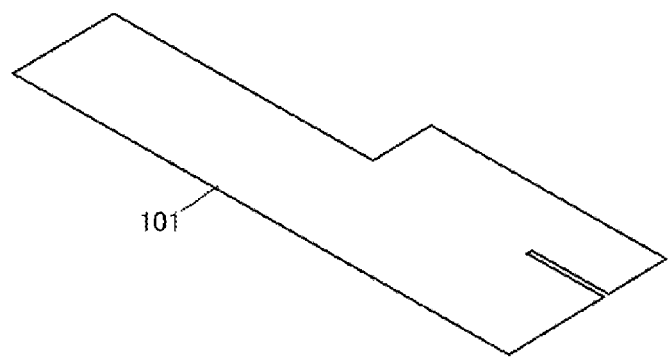
Figure 4:
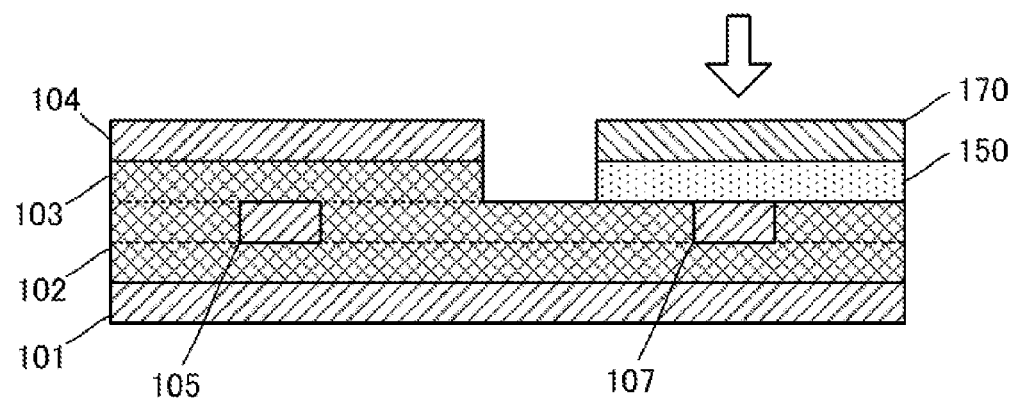
FIG. 4 is a cross-sectional view of line A-A illustrated in FIG. 3(C).

As illustrated in FIGS. 3(B) and 4, the piezoelectric film 150 is disposed at a different position from the resin base material 103 on the side of the transmission line, in a planar view. That is, the piezoelectric film 150 and the transmission line are disposed so as not to be overlapped in a planar view. Therefore, even in the case where the piezoelectric film 150 and the resin base material on the side where the piezoelectric film 150 is disposed are distorted when the user presses the casing 50, the resin base material on the side of the transmission line does not deform greatly, and the impedance of the transmission line does not change significantly.

Figure 6A:
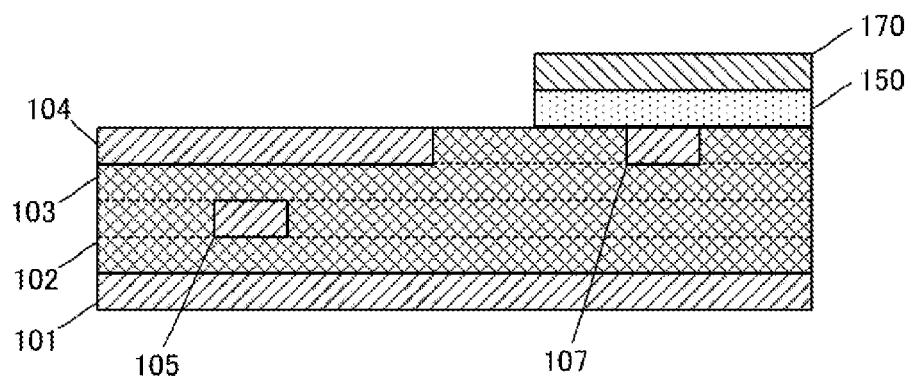
FIGS. 6(A), 6(B) and 6(C) are cross-sectional views illustrating a structure of a modification of the deformation detection sensor.
Figure 6B:
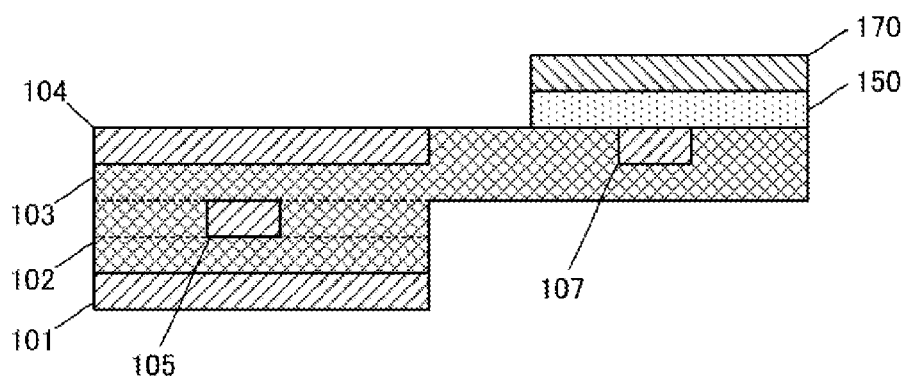
Figure 6C:
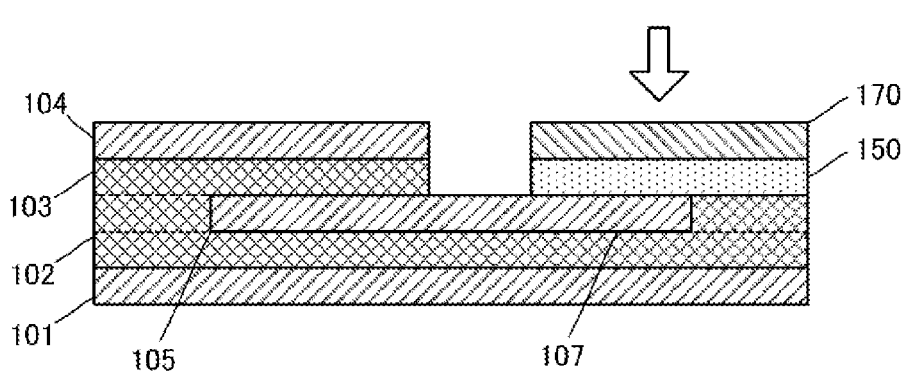

Next, FIGS. 6(A), 6(B) and 6(C) are cross-sectional views illustrating a structure of the deformation detection sensor according to a modification.

In the deformation detection sensor illustrated in FIG. 6(A), the resin base material 103 is also disposed on the side of the piezoelectric element, and the cross-sectional shape thereof is rectangular. Also, in this case, the deformation detection sensor is manufactured by attaching the piezoelectric film 150 to the laminated body integrally formed by hot pressing after the hot pressing. Thus, it is possible to realize the deformation detection sensor 10 including the function of the transmission line without subjecting the piezoelectric film 150 to high heat. Further, the piezoelectric film 150 and the transmission line are disposed so as not to overlap each other in a planar view. Therefore, even in the case where the piezoelectric film 150 and the resin base material on the side where the piezoelectric film 150 is disposed are distorted, the resin base material on the side of the transmission line does not deform greatly, and the impedance of the transmission line does not change significantly.

Further, as illustrated in FIG. 6(B), in the aspect in which the resin base material 102 is not disposed on the side of the piezoelectric element, similarly, the piezoelectric film 150 and the transmission line are disposed so as not to overlap each other in a planar view. Accordingly, in the case where the piezoelectric film 150 and the resin base material on the side where the piezoelectric film 150 is disposed are distorted when the user presses the casing 50, the resin base material on the side of the transmission line does not deform greatly, and the impedance of the transmission line does not change significantly.

The deformation detection sensor 10 in FIG. 6(C) is an example in which the signal line conductor 105, the first detection electrode 107, and the second detection electrode 109 are formed of the same conductive member. The transmission line transmits frequency signals of several kHz or more. On the other hand, the change in electric charge generated by the piezoelectric film 150 is about several Hz to dozens of Hz. Therefore, in the case where the signal line conductor 105, the first detection electrode 107, and the second detection electrode 109 are made of a common conductive member, it is possible to distinguish between a signal (a piezoelectric signal) from the first detection electrode 107 and a high frequency signal from the signal line conductor 105. Accordingly, it is not necessary to separately provide wiring lines, and it is possible to achieve space saving. Further, it is possible to reduce the number of poles of the connector. A more desirable aspect is that, in the first detection electrode 107 and the signal line conductor 105, signals are synthesized by a frequency discrimination circuit like a Bias-T or a diplexer, and the signals are transmitted through the same wiring line. In front of the amplifier circuit of the piezoelectric signal, a signal (a piezoelectric signal) from the first detection electrode 107 and a high frequency signal from the signal line conductor 105 are branched by the frequency discrimination circuit, and connected to desired circuits, respectively. Accordingly, it is possible to suppress deterioration of the characteristics as compared with the case where separate wiring lines are used.

Subsequently, FIGS. 7(A) and 7(B) are views illustrating an example of an arrangement aspect of the deformation detection sensor in the casing 50. The example of FIG. 7(A) has the transmission line and the piezoelectric element disposed on the side surface of the casing 50. The volume operation unit 501 and the volume operation unit 502 are disposed on the side surface of the casing 50. The user presses the position of the volume operation unit 501 or the volume operation unit 502 disposed on the side surface of the casing 50 to perform the volume change operation.

The example of FIG. 7(B) has the transmission line disposed on the bottom surface of the casing 50, and the piezoelectric element is disposed on the side surface of the casing 50. The volume operation unit 501 and the volume operation unit 502 are displayed on the side surface of the casing 50. The user presses the position of the volume operation unit 501 or the volume operation unit 501 disposed on the side surface of the casing 50 to perform the volume change operation.

In this case, as illustrated in FIG. 8, in the deformation detection sensor 10 a bent portion (a curved portion) is present between the side of the transmission line and the side of the piezoelectric element. Thus, it is possible to reduce transmission of the distortion on the side of the piezoelectric element to the side of the transmission line.

It is to be noted, each of the above embodiments is the aspect in which the piezoelectric element and the transmission line are not overlapped in a planar view. However, as illustrated in FIG. 9, the piezoelectric element and the transmission line may be laminated and overlap each other.

Figure 9:
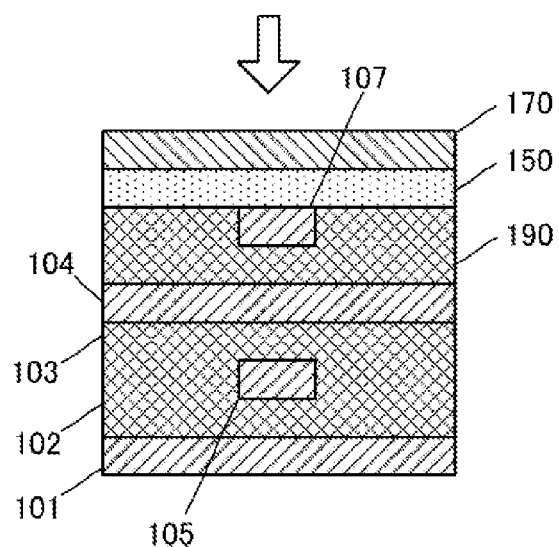
FIG. 9 is a cross-sectional view when a piezoelectric sensor and a transmission line are laminated.

In the example of FIG. 9, the piezoelectric film 150, the first detection electrode 107 and the second detection electrode 109 constituting the piezoelectric element overlap with the signal line conductor 105 constituting the transmission line in a plan view. The second ground conductor 104 is disposed on the lower surface side of the piezoelectric element. The second ground conductor 104 functions as a shield conductor of the transmission line and also functions as a shield conductor of the piezoelectric element.

In the structure of FIG. 9, there is a common shield conductor, which is harder than the resin base material, between the piezoelectric element and the transmission line. Therefore, even when the piezoelectric element side is pressed, the resin base material on the side of the transmission line does not deform greatly and the impedance of the transmission line does not change greatly. In this case, the area occupied by the deformation detection sensor 10 is reduced, which enables the sensor to be placed in a narrow space.

It is to be noted, in this embodiment, as an example, the deformation detection sensor detects the pressing operation at the position corresponding to the volume change operator to receive the volume change operation. However, another configuration may be adopted where the deformation detection sensor receives the pressing operation at positions corresponding to various operators such as a power button, a home button, and mute button. Further, an electronic component such as an amplifier circuit, a matching circuit or a control circuit may be mounted on the deformation detection sensor. Mounting the electronic component on the deformation detection sensor allows for, for example, a reduction in influence of surrounding noises on a signal from a pressure sensor.

DESCRIPTION OF REFERENCE SYMBOLS

1: electronic device
10: deformation detection sensor
50: casing
81: battery module
101: first ground conductor
102, 103: resin base material
104: second ground conductor
105: signal line conductor
107: first detection electrode
109: second detection electrode
150: piezoelectric film
170: conductive thin film member
171: printed circuit board
181: printed circuit board
501, 502: volume operation unit

The invention claimed is:

1. A deformation detection sensor comprising:
a thermoplastic resin body which has a main surface;
a conductive member on the main surface of the resin body; and
a piezoelectric film attached to the thermoplastic resin body,
wherein a first portion of the conductive member and the thermoplastic resin body are arranged to form a transmission line, and
a second portion of the conductive member, the thermoplastic resin body, and the piezoelectric film are arranged to form a piezoelectric element.

2. The deformation detection sensor according to claim 1, wherein
the piezoelectric film and the transmission line are disposed so as to overlap each other in a planar view, and
a ground conductor is positioned between the piezoelectric film and the transmission line.

3. The deformation detection sensor according to claim 1, wherein the piezoelectric element and the transmission line are disposed so as to not overlap each other in a planar view.

4. The deformation detection sensor according to claim 3, wherein the thermoplastic resin body between the piezoelectric element and the transmission line is bent.

5. The deformation detection sensor according to claim 1, wherein the transmission line and a signal line of the piezoelectric element are made of a single conductive member.

6. The deformation detection sensor according to claim 1, wherein
the first portion of the conductive member includes a first signal line and a second signal line, and
a part of the thermoplastic resin body is removed between the first signal line and the second signal line.

7. The deformation detection sensor according to claim 6, wherein the first portion of the conductive member and the second portion of the conductive member are separate from each other.

8. The deformation detection sensor according to claim 1, wherein the first portion of the conductive member and the second portion of the conductive member are separate from each other.

9. The deformation detection sensor according to claim 1, wherein thermoplastic resin body includes a resin base material selected from a liquid crystal polymer resin, polyetheretherketone, polyetherimide, polyphenylene sulfide, or polyimide.

10. An electronic device comprising:
a casing; and
the deformation detection sensor according to claim 1 within the casing; and
wherein a main surface of the piezoelectric film is arranged parallel to a side surface of the casing.

* * * * *